(12) United States Patent
Deshpande et al.

(10) Patent No.: US 6,887,798 B2
(45) Date of Patent: May 3, 2005

(54) STI STRESS MODIFICATION BY NITROGEN PLASMA TREATMENT FOR IMPROVING PERFORMANCE IN SMALL WIDTH DEVICES

(75) Inventors: Sadanand V. Deshpande, Fishkill, NY (US); Bruce B. Doris, Brewster, NY (US); Werner A. Rausch, Stormville, NY (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,047

(22) Filed: May 30, 2003

(65) Prior Publication Data

US 2004/0242010 A1 Dec. 2, 2004

(51) Int. Cl.$^7$ .................... H01L 21/31; H01L 21/469

(52) U.S. Cl. .................... 438/777; 438/435; 438/710; 438/776

(58) Field of Search .................... 438/435, 424, 438/776, 777

(56) References Cited

U.S. PATENT DOCUMENTS

| | | | |
|---|---|---|---|
| 3,602,841 A | 8/1971 | McGroddy | |
| 4,655,415 A | 4/1987 | Esaki et al. | |
| 4,853,076 A | 8/1989 | Tsaur et al. | |

(Continued)

OTHER PUBLICATIONS

Rim, et al., "Transconductance Enhancement in Deep Sub-micron Strained-Si n-MOSFETs", International Electron Devices Meeting, 26, 8, 1, IEEE, Sep. 1998.

Rim, et al. "Characteristics and Device Design of Sub-100 nm Strained Si N-and PMOSFETs", 2002 Symposium On VLSI Technology Digest of Technical Papers, IEEE, pp. 98–99.

Scott, et al. "NMOS Drive Current Reduction Caused by Transistor Layout and Trench Isolation Induced Stress", International Electron Devices Meeting, 34.4.1, IEEE, Sep. 1999.

Ootsuka, et al. "A Highly Dense, High-Performance 130nm node CMOS Technology for Large Scale System-on-a-Chip Application", International Electron Device Meeting, 23.5.1, IEEE, Apr. 2000.

Ito, et al. "Mechanical Stress Effect on Etch–Stop Nitride and its Impact on Deep Submicron Transistor Design", International Electron Devices Meeting, 10.7.1, IEEE, Apr. 2000.

Shimizu, et al. "Local Mechanical–Stress Control (LMC): A New Technique for CMOS–Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

*Primary Examiner*—Amir Zarabian
*Assistant Examiner*—Pamela E Perkins
(74) *Attorney, Agent, or Firm*—Scully, Scott, Murphy & Presser; Joseph P. Abate, Esq.

(57) ABSTRACT

A method for modulating the stress caused by bird beak formation of small width devices by a nitrogen plasma treatment. The nitrogen plasma process forms a nitride liner about the trench walls that serves to prevent the formation of bird beaks in the isolation region during a subsequent oxidation step. In one embodiment, the plasma nitridation process occurs after trench etching, but prior to trench fill. In yet another embodiment, the plasma nitridation process occurs after trench fill. In yet another embodiment, a block mask is formed over predetermined active areas of the etched substrate prior to the plasma nitridation process. This embodiment is used in protecting the PFET device area from the plasma nitridation process thereby providing a means to form a PFET device area in which stress caused by bird beak formation increases the device performance of the PFET.

12 Claims, 5 Drawing Sheets

U.S. PATENT DOCUMENTS

| | | | |
|---|---|---|---|
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,081,843 A | 4/1992 | Ohtaka et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,780,346 A | 7/1998 | Arghavani et al. | |
| 5,811,347 A | 9/1998 | Gardner et al. | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,118,168 A | 9/2000 | Moon et al. | |
| 6,156,620 A * | 12/2000 | Puchner et al. | 438/400 |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,925 B1 | 7/2001 | Arghavani et al. | |
| 6,261,964 B1 | 7/2001 | Wu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 5,134,085 A1 | 7/2002 | Gilgen et al. | |
| 6,436,790 B2 | 8/2002 | Ito | |
| 6,479,367 B2 * | 11/2002 | Park | 438/424 |
| 6,486,039 B2 * | 11/2002 | Yoo et al. | 438/425 |
| 6,498,383 B2 | 12/2002 | Beyer et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 2001/0009784 A1 | 7/2001 | Ma et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2002/0177270 A1 * | 11/2002 | Beyer et al. | 438/221 |
| 2003/0015736 A1 | 1/2003 | Beyer et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |

* cited by examiner

STI STRESS MODIFICATION BY NITROGEN PLASMA TREATMENT FOR IMPROVING PERFORMANCE IN SMALL WIDTH DEVICES

BACKGROUND OF INVENTION

The present invention generally relates to semiconductor processing, and more particularly to a method of fabricating isolation regions, such as shallow trench isolation (STI), in which the stress of the isolation region has by modulated by a nitrogen plasma treatment. The isolation regions created in the present invention, which are particularly useful in small width devices (on the order of about 0.25 Âµm or less), have substantially little or no bird beaks in the isolation region.

Figure 1A:
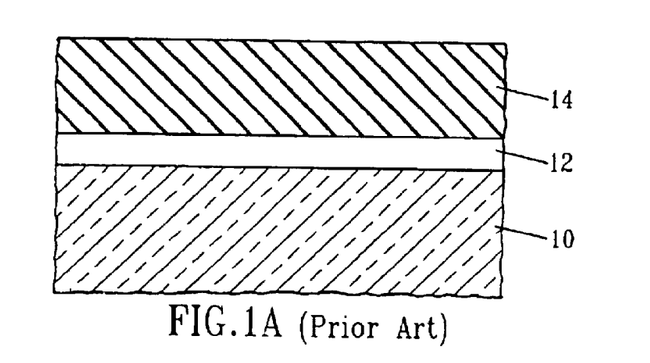
FIGS. 1A–1C are pictorial representations (through cross sectional views) illustrating the prior art process of forming a shallow trench isolation (STI) region.

In the semiconductor industry, it is well known to isolate one or more device regions present on a semiconductor structure using isolation regions such as shallow trench isolaton (STI) regions. A standard STI process is shown, for example, in FIGS. 1A–1C. Specifically, prior art FIG. 1A illustrates an initial processing step in which a pad stack comprising an oxide 12 and a nitride 14 is formed atop a surface of a semiconductor substrate 10. An optional hard mask (not shown) may also be formed atop the nitride layer 14 of the pad stack.

Next, lithography is employed in providing a trench pattern to the structure. Specifically, the trench pattern is formed by first applying a photoresist on the upper surface of the pad stack. The photoresist is then exposed to a pattern of radiation and thereafter the pattern in the photoresist is developed using a resist developer. An etching step is used to transfer the pattern from the photoresist into the nitride layer 14. After the initial pattern transfer, the photoresist is removed utilizing a stripping process and then etching continues through the oxide layer 12 stopping atop an upper surface of the semiconductor substrate 10 so as to provide a structure having an opening 16 in the oxide layer 12 as shown, for example, in FIG. 1B.

Figure 1B:
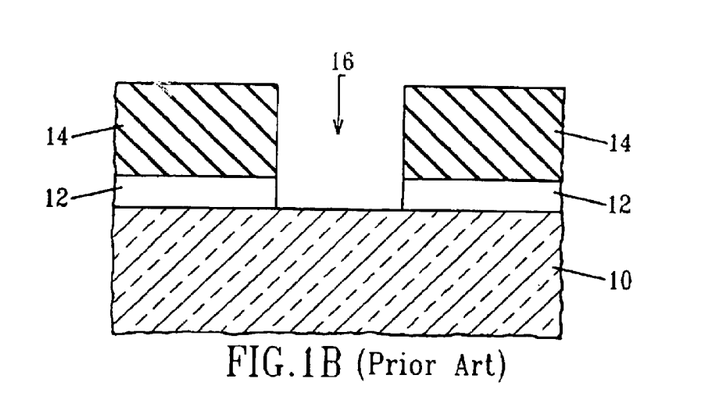
Figure 1C:
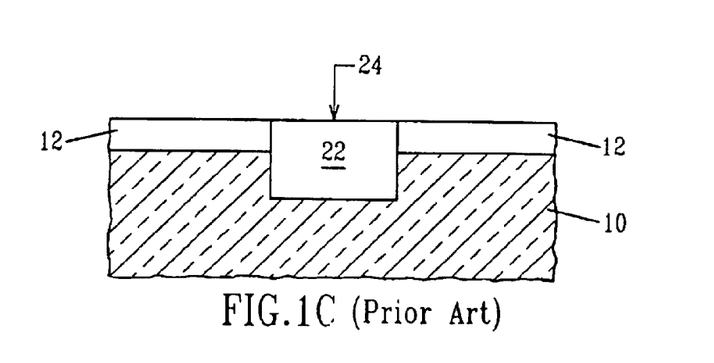

After providing the structure shown in FIG. 1B, a trench is formed in the semiconductor substrate 10 via etching through the opening 16. A trench liner (not shown) is typically formed via oxidation on the bare sidewalls of the trench including the sidewalls of the oxide layer 12. The trench is then filled with a trench dielectric material 22 such as $SiO_2$, tetraethylorthosilicate (TEOS) or a high-density plasma oxide and thereafter the structure is planarized to the upper surface of the nitride layer 14. A deglazing process may follow the trench fill step. After deglazing, the nitride layer 14 is removed providing a structure having an STI region 24 formed in the surface of the semiconductor substrate 10. The structure including STI region 24 is shown, for example, in FIG. 1C.

The oxide layer 12 may be removed prior to CMOS (complementary metal oxide semiconductor) device fabrication. CMOS device fabrication may include the following processing steps:
1. A conventional gate oxidation pre-clean, and gate dielectric formation;
2. Gate electrode formation and patterning;
3. Gate reoxidation;
4. Sourceldrain extension formation;
5. Sidewall spacer formation by deposition and etching;
6. Source/drain formation;
7. Silicide formation; and
8. Back-end-of-the-line (BEOL) process.

Figure 2:
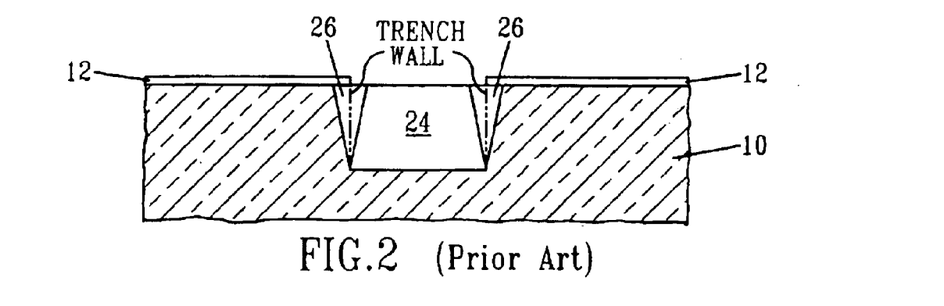
FIG. 2 is a pictorial representation (through a cross sectional view) illustrating the formation of a bird beak in the STI region provided by FIGS. 1A–1C.

During the oxidation procedures used in steps 1 and 3, bird beaks 26 begin to form in the STI regions 24 at or near the interface between the STI 24 and the semiconductor substrate 10; bird beaks are oxide regions that are formed during CMOS device oxidation processes that encroach upon and, in some instances, enter the islands of the semiconductor substrate 10 which lie adjacent to the STI regions. This encroachment and subsequent entry into the semiconductor islands causes the semiconductor substrate 10 to exhibit uneven stress in the active device areas. This uneven stress may negatively impact some of the devices, while positively affecting other devices present on the semiconductor substrate. Bird beak formation is particularly relevant for small width semiconductor devices that have a width of about 0.25 Âµm or less.

Specifically, stress caused by bird beak formation is known to lead to device degradation for NFET devices and device improvements for PFETs. In particular, the device drive current and the device on-current can be affected (either negatively or positively) by bird beak formation. To date, applicants are unaware of any prior art method that seeks a means to tailor the stress caused by bird beak formation so as to improve the device performance of NFETs and PFETs.

In view of the drawbacks mentioned above with the prior art process of fabricating STI regions, there is a need for providing a method of forming isolation regions such as STIs, in which bird beak formation is substantially prevented thereby reducing the stress in the semiconductor substrate. There is also a need for providing a method in which stress formation is controlled such that improved device performance, in terms of drive current and on-current, can be achieved for a structure containing both NFETs and PFETs.

SUMMARY OF INVENTION

An object of the present invention is to provide a method of fabricating isolation regions, such as shallow trench isolation regions, for use in small width devices (on the order of about 0.25 Âµm or less).

A further object of the present invention is to provide a method of fabricating isolation regions that exhibit substantially little or no bird beak formation during a subsequent CMOS oxidation process.

A yet further object of the present invention is to provide a method of fabricating isolation regions in which the stress caused by bird beak formation has been modulated to enhance device performance.

An even further object of the present invention is to provide a method of fabricating isolation regions in which the stress caused by bird peak formation is reduced for NFETs.

A still further object of the present invention is to provide a method in which stress formation caused by bird beak formation is controlled such that improved device performance, in terms of drive current and on-current, can be achieved for a structure containing both NFETs and PFETs.

It is noted that the term "isolation regions" as used throughout the instant application denotes trench isolation regions. The isolation regions formed in the present invention can be classified in accordance to their depth. In particular, the present invention contemplates the formation of shallow trench isolation (STI) regions having a depth, as measured from the top surface of the substrate to the bottom of the trench, of about 1.0 Âµm or less, medium trench isolation regions having a depth, as measured from the top surface of the substrate to the bottom of the trench, of about 1.0 Âμm to about 3.0 Âμm, and deep trench isolation (DTI) regions having a depth, as measured from the top surface of the substrate to the bottom of the trench, of about 3.0 Âμm or greater.

The isolation regions formed in the present invention may, or may not, have a high aspect ratio associated therewith. When a high aspect ratio trench isolation region is formed, the aspect ratio (height:width) is about 0.5 or greater.

The aforementioned objects and advantages are achieved in the present invention by forming a nitride liner, i.e., a surface nitrided layer, about the trench walls (bottom and sidewalls) by using a plasma nitridation process. Because of the plasma nitridation used in the present invention, the nitride liner penetrates the bottom and sidewalls of the trench so as to form a liner that is present in the interior as well as the exterior of the trench walls. The nitride liner formed using the plasma nitridation process of the present invention serves to prevent the formation of bird beaks in the isolation region during a subsequent CMOS oxidation step.

The plasma nitridation process of the present invention may occur during the formation of the isolation region. In one embodiment, the plasma nitridation process may occur after trench etching, but prior to trench fill In yet another embodiment of the present invention, the plasma nitridation process occurs after filling the trench with a trench dielectric material. In yet another embodiment of the present invention, a block mask is formed over predetermined active areas of the etched substrate prior to the plasma nitridation process. This embodiment is used in protecting the PFET device area from the plasma nitridation process thereby providing a means to form a PFET device area in which compression stress caused by bird beak formation increases the device performance of the PFET.

In broad terms, the method of the present invention comprises the steps of:

providing a structure having a patterned material stack located on top of a surface of a semiconductor substrate, said patterned material stack having at least one opening that exposes a portion of the semiconductor substrate;

forming at least one trench into the exposed portion of the semiconductor substrate, each trench having sidewalls that extend to a common bottom wall; and subjecting at least one of the sidewalls of each trench and a portion of the common bottom wall of each trench to a plasma nitridation process.

As stated above, the plasma nitridation process may occur prior to trench fill, or after the trench has been filled with a dielectric fill material. In some instances, and after the trench fill has been performed, portions of the patterned material stack are removed and a block mask is formed over active areas of the semiconductor substrate in which PFETs are to be formed. In this embodiment, the block mask is formed atop the structure after the dielectric fill step. The block mask is located predominately over the active device region in which the NFET devices will be formed. Edge portions of the block mask typically extend over the sidewalls of at least two neighboring trenches.

Another aspect of the present invention relates to a semiconductor structure which comprises:

a semiconductor substrate having at least one trench isolation region located therein, said at least one trench isolation region having sidewalls that extend to a common bottom wall; and a nitride liner present at least on portions of the sidewalls, said nitride liner protecting the sidewalls of the at least one trench so as to reduce stress in the semiconductor substrate.

DETAILED DESCRIPTION

The present invention, which provides a method for modifying the stress caused by bird beak formation in the isolation regions of small width CMOS devices, will now be described in greater detail by referring to the drawings that accompany the present application. In the drawings representing the present invention, like reference numerals are used in describing like and/or corresponding elements.

Figure 3A:
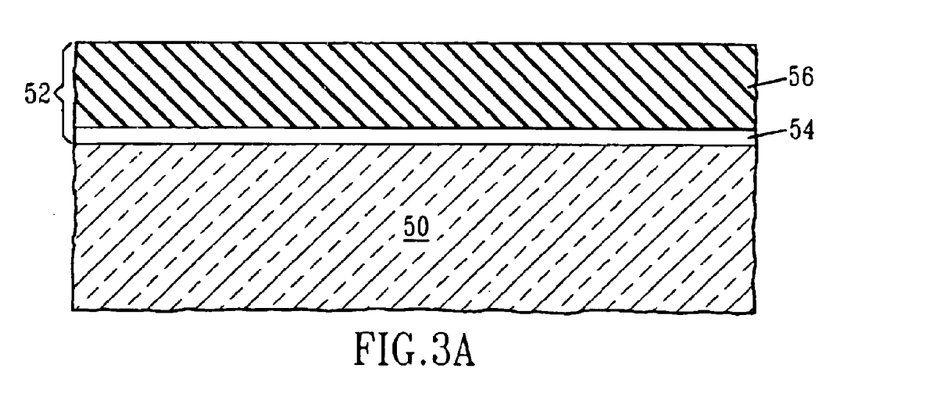
FIGS. 3A–3E are pictorial representations (through cross sectional views) illustrating the basic processing steps in one embodiment of the present invention.

Reference is first made to the embodiment depicted in FIGS. 3A–3E. 3E. In this embodiment of the present invention, the trench is subjected to a plasma nitridation process prior to filling the trench with a trench fill material. Specifically, FIG. 3A shows an initial structure of the first embodiment of the present application. In FIG. 3A, there is shown a semiconductor substrate 50 having a material stack 52 located on a surface of the semiconductor substrate 50. Material stack 52 comprises at least a pad oxide 54 and a pad nitride 56. As shown, the pad oxide 54 is located on an upper surface of the semiconductor substrate 50, while the pad nitride 56 is typically applied on top of the pad oxide 54.

The semiconductor substrate employed in the present invention is any semiconducting material well known to those skilled in the art. This includes Si-containing semiconductor materials as well as Ge, GaAs, InP and other III/V compound semiconductors. Preferred semiconductor substrates employed in the present invention are Si-containing semiconductor materials which include, but are not limited to: Si, SiGe, SiGeC, SiC, a silicon-on-insulator (SOI) and combinations thereof, e.g., a stack of SilSiGe or SUSOI. The SOI substrate includes a buried oxide layer that electrically isolates a top Si-containing layer, i.e., the SOI layer, from a bottom Si-containing layer.

When an SOI substrate is employed in the present invention, the top Si-containing layer of the SOI substrate may have a vertical thickness, $t_s$, i.e., height, of less than about 300 nm, with a vertical thickness of from about 50 nm to about 100 nm being more highly preferred. The thickness of the buried oxide may vary, but typically, the buried insulating layer has a thickness of less than about 350 nm, with a thickness of from about 1 nm to about 100 nm being more highly preferred. The thickness of the bottom Si-containing layer of the SOI substrate is inconsequential to the present invention.

The SOI substrate is fabricated using techniques that are well known to those skilled in the art. For example, the SOI substrate may be fabricated using a thermal bonding process, or alternatively the SOI substrate may be fabricated by an ion implantation process that is referred to in the art as separation by ion implantation of oxygen (SIMOX). When a thermal bonding process is employed in fabricating the SOI substrate, an optional thinning step may be utilized to thin the top Si-containing layer into an ultra-thin regime which is on the order of less than 50 nm.

The pad oxide 54 is formed on the upper surface of the semiconductor substrate 50 using either a thermal oxidation process or a deposition process such as chemical vapor deposition (CVD), plasma-assisted CVD, chemical solution deposition, atomic layer deposition or evaporation. The thickness of the pad oxide 54 may vary depending upon the technique used in forming the same. Typically, however, the pad oxide 54 has a thickness of from about 1 nm to about 40 nm.

After the pad oxide 54 has been formed on the semiconductor substrate 50, the pad nitride 56 is typically formed on top of the pad oxide 54 using a conventional deposition process such as CVD, plasma-assisted CVD, chemical solution deposition, atomic layer deposition, or evaporation. The thickness of the pad nitride 56 may vary depending on the technique used in forming the same. Typically, the pad nitride 56 has a thickness of from about 60 nm to about 150 nm.

After providing the material stack 52 to the semiconductor substrate 50, a photoresist (not shown) is applied to the upper exposed surface layer of the material stack 52, i.e., on the pad nitride 56, by a deposition process such as CVD, plasma-assisted CVD, spin-on coating, or evaporation. The photoresist is then patterned by lithography which includes the steps of exposing the photoresist to a pattern of radiation and developing the pattern by using a conventional resist developer. The pattern formed in the present invention is a trench pattern. The trench pattern is then transferred into the material stack 52 utilizing one or more etching steps.

In particular, the pattern transfer is accomplished by first etching through exposed portions of the patterned photoresist utilizing an etching process that is selective in removing nitride (in this instance, etching stops atop the pad oxide 54). Once the trench pattern has been transferred into the pad nitride 56, the patterned photoresist is typically removed from the structure utilizing a conventional resist stripping process that is well known to those skilled in the art Etching of the trench pattern continues into the underlying pad oxide 54 utilizing an etching process that is selective in removing oxide. This etching step stops atop an upper surface of the semiconductor substrate 50.

Figure 3B:
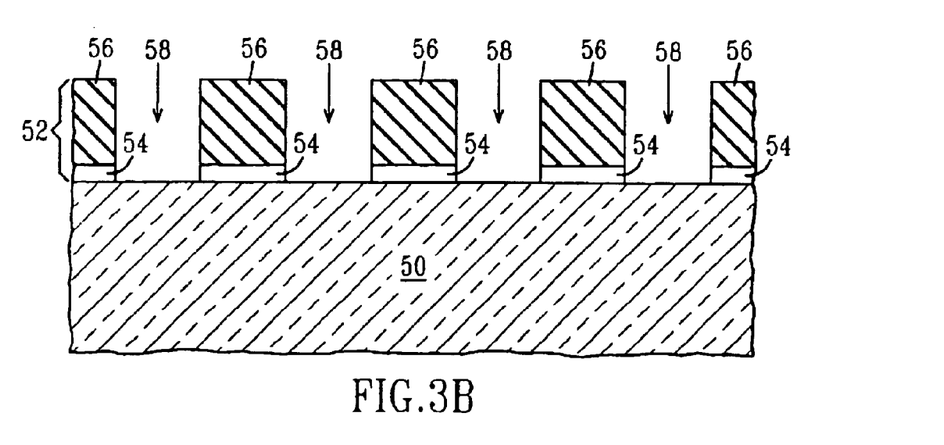

The resultant structure, which is formed after the patterning and etching steps have been performed, is shown, for example, in FIG. 3B. Specifically, FIG. 3B illustrates a structure comprising the semiconductor substrate 50 containing a patterned material stack 52 having at least one opening 58 that exposes portions of the semiconductor substrate 50.

Figure 3C:
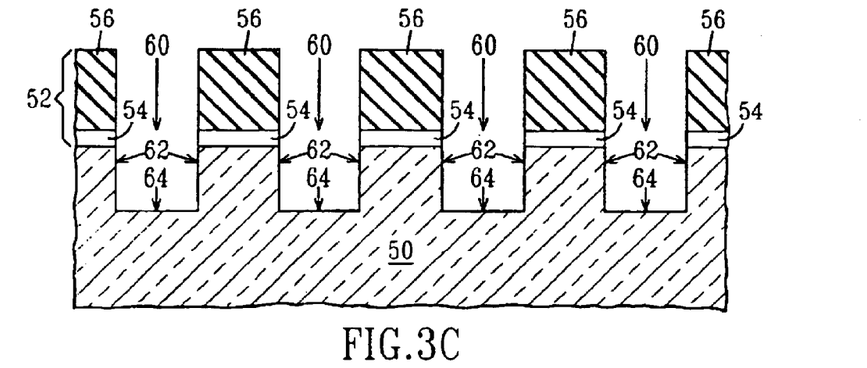

Next, the exposed portions of the semiconductor substrate that are not protected with the patterned material stack, i.e., the patterned pad oxide 54 and pad nitride 56, are then removed utilizing an etching process that is highly selective in removing semiconductor substrate material providing the structure shown in FIG. 3C. The illustrated structure shown in FIG. 3C includes at least one trench 60 in the semiconductor substrate 50. Each of the trenches 60 formed in this step of the present invention have sidewalls 62 that extend to a common bottom wall 64.

The depth of the trenches is controlled by the conditions used to etch the exposed portions of the semiconductor substrate 50. The trenches 60 formed in the present invention may be shallow trenches, medium trenches and deep trenches. The shallow trenches have a depth, as measured from the top surface of the substrate to the bottom of the trench, of about 1.0 Âµm or less, the medium trenches have a depth, as measured from the top surface of the substrate to the bottom of the trench, of about 1.0 Âµm to about 3.0 Âµm, and deep trenches have a depth, as measured from the top surface of the substrate to the bottom of the trench, of about 3.0 Âµm or greater.

At this point of the present invention, the structure shown in FIG. 3C may be subjected to a nitrogen plasma treatment step. That is, a plasma nitridation process may now be performed on the structure shown in FIG. 3C. The structure formed during the nitrogen plasma treatment is shown in FIG. 3D.

Figure 3D:
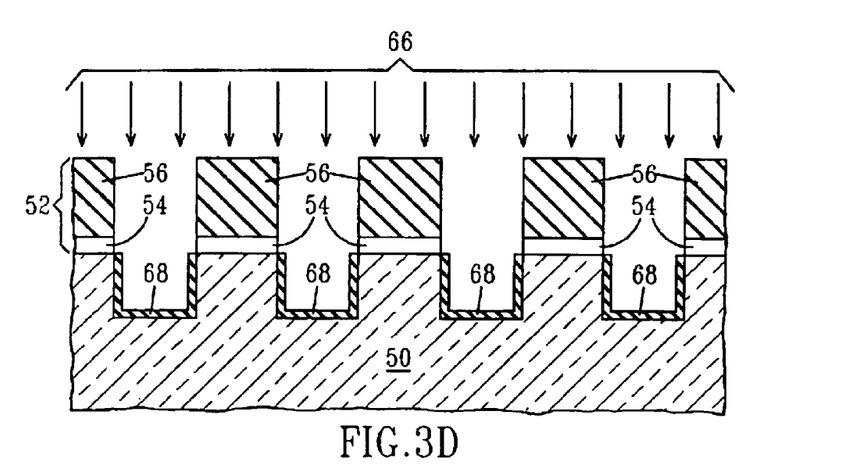
Figure 3E:
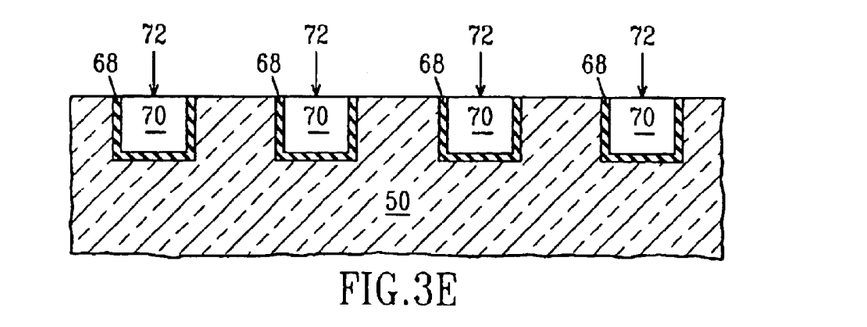

As shown in FIG. 3D, the structure is treated by a plasma of nitrogen 66 that is capable of forming a nitride liner 68 about the interior and exterior sidewalls and bottom walls of the trench. The nitride liner 68 may be referred to herein as a surface nitrided layer since some of the nitride layer forms inward into the surrounding islands of semiconductor substrate 50. Semiconductor islands are defined as the pillar regions of semiconductor material that lies adjacent to each of the trenches provided during the above patterning and etching steps. The terms "nitride liner" and "nitrided surface layer" are interchangeable in the present invention. As shown in the embodiment depicted in FIG. 3D, nitride liner 68 lines the sidewalls 62 and the bottom wall 64 of each trench 60. Although not shown, some of nitride liner 68 enters into the semiconductor substrate 50 surrounding the trenches 60.

The plasma nitridation is carried out in a nitrogen-containing atmosphere such as $N_2$, NO, $N_2O$, and $NH_3$. Mixtures of the aforementioned nitrogen-containing atmospheres are also contemplated herein. The present invention also contemplates plasma nitridation processes wherein the nitrogen-containing gas is admixed with an inert gas such as He, Ar, Ne, Kr or Xe. Mixtures of inert gasses such as He and Ar are also contemplated herein. When an inert gas is present, the plasma contains a concentration of nitrogen-containing gas of about 5 to about 70%. A highly preferred nitrogen plasma employed in the present invention is $N_2$ in He.

The plasma nitridation process of the present invention is carried out using a plasma having a temperature of about 80Â° C. or below, with a plasma temperature of from about 25Â° C. to about 50Â° C. being more highly preferred. The substrate during the plasma nitridation process is maintained at a temperature of from about 20Â° C. to about 100Â° C., with a substrate temperature of from about 25Â° C. to about 80Â° C. being more highly preferred. The substrate temperature is maintained within the foregoing ranges using a backside cooling process in which an inert gas such as He is flow over the back surface of the substrate.

The nitrogen species used in the present invention will form ions that react with the semiconductor surface and form a nitrogen rich surface layer on the trench sidewalls and bottom walls.

The plasma nitridation process may be carried out using rapid thermal conditions wherein short heating times (on the order of about 120 seconds or less) are employed. Hence, the present invention contemplates rapid thermal (RT) nitridation processes such as RTNH, RTNO, $RTNO_2$, rapid plasma nitridation (RPN) or a decoupled plasma nitridation (DPN) process.

A preferred plasma nitridation process employed in the present invention is a DPN process in which the following preferred conditions are employed:

Pressure range: 50–100 mTorr;

Gas composition: 2–10% $N_2$ in He;

Power range: 50–200 Watts;

Plasma exposure time: 10–50 seconds;

Wafer temperature: 50° C.–100° C.

Notwithstanding which technique is employed in forming the nitrided surface layer 68, the nitrided surface layer 68 formed has a thickness of from about 0.1 to about 2 nm, with a thickness of from about 1.0 to about 1.5 nm being more highly preferred. Some of the nitride thickness may form inward into the semiconductor substrate 50.

Following the nitridation process shown in FIG. 3D, each of the trenches is then filled with a trench dielectric material 70 such as $SiO_2$ tetraethylorthosilicate (TEOS) or a high-density plasma oxide and thereafter the structure is planarized to the upper surface of the nitride pad 56. In an optional step, an oxide liner (not shown) may be formed in the trench prior to trench fill. A deglazing process may follow the trench fill step. After deglazing, the nitride pad 56 and the pad oxide 54 are removed providing a structure having isolation regions 72 formed in the surface of the semiconductor substrate 50. The resultant structure formed after these steps have been performed is shown, for example, in FIG. 3E.

After stripping the pad nitride and the pad oxide from the structure, conventional CMOS device fabrication processes may now be performed which include at least the following: conventional gate oxidation pre-clean, and gate dielectric formation; gate electrode formation and patterning; gate reoxidation; source/drain extension formation; sidewall spacer formation by deposition and etching; source/drain formation; silicide formation; and a back-end-of-the-line (BEOL) process.

During the oxidation procedures used above in forming the CMOS device, bird beaks form in conventional STI regions at or near the interface between the STI and substrate. In the present invention, nitrided surface layer 68 substantially prevents bird beaks from forming. In the embodiment shown in FIGS. 3A–3E, the stress in the active areas is reduced since bird beak formation is substantially eliminated.

Figure 4A:
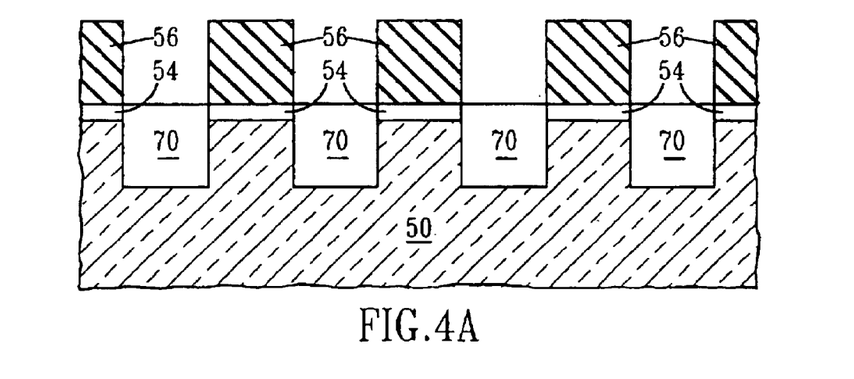
FIG. 4A–4B are pictorial representations (through cross sectional views) illustrating the basic processing steps in another embodiment of the present invention.
Figure 4B:
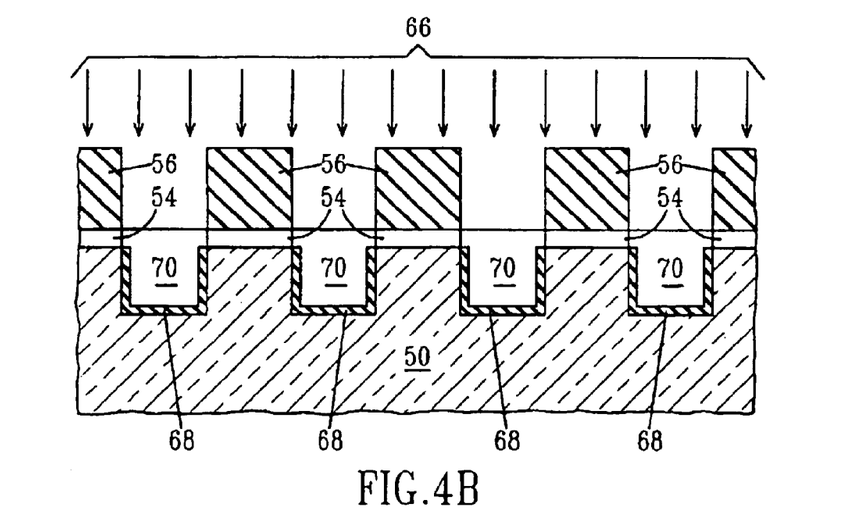

In addition to the embodiment shown in FIGS. 3A–3E, the present invention also contemplates an embodiment in which the plasma nitridation process occurs after the trenches have been filled. This embodiment of the present invention is shown in FIGS. 4A–4B. In this embodiment of the present invention, the structure shown in FIG. 3C is first provided using the procedures described above. Instead, of conducting a plasma nitridation process after the trenches have been etched into the semiconductor substrate 50 (as is the case in FIG. 3D), the trenches 60 are filled with a trench dielectric material 70 such as $SiO_2$, tetraethylorthosilicate (TEOS) or a high-density plasma oxide and thereafter the structure is planarized to the upper surface of the nitride pad 56 and then recessed to the upper surface of pad oxide 54. Prior to trench fill, an optional oxide liner may be formed. A deglazing process may follow the trench fill step. FIG. 4A shows the structure formed at this point of the present invention.

After deglazing, the nitrogen plasma treatment step described above can be performed on the structure shown in FIG. 4A. The structure formed during the nitrogen plasma treatment is shown in FIG. 4B. As shown, the structure is treated by a plasma of nitrogen 66 that is capable of forming a nitride liner 68 about the interior and exterior sidewalls and bottom walls of the trench. As shown in the embodiment depicted in FIG. 4B, nitride liner 68 lines the sidewalls 62 and the bottom wall 64 of each trench 60.

Next, the pad nitride 56 and the pad oxide 54 are removed providing a structure having isolation regions formed in the surface of the semiconductor substrate. The resultant structure formed after the foregoing steps have been performed is similar to that shown in FIG. 3E. After stripping the pad nitride and the pad oxide from the structure, conventional CMOS device fabrication processes may now be performed which include at least the following: conventional gate oxidation pre-clean, and gate dielectric formation; gate electrode formation and patterning; gate reoxidation; source/drain extension formation; sidewall spacer formation by deposition and etching; source/drain formation; silicide formation; and a back-end-of-the-line (BEOL) process.

During the oxidation procedures used above in forming the CMOS device, bird beaks form in conventional STI regions at or near the interface between the STI and substrate. In the present invention, nitrided surface layer 68 substantially prevents bird beaks from forming. In the embodiment shown in FIGS. 4A–4B, the stress in the active areas is reduced since bird beak formation is substantially eliminated.

Figure 5A:
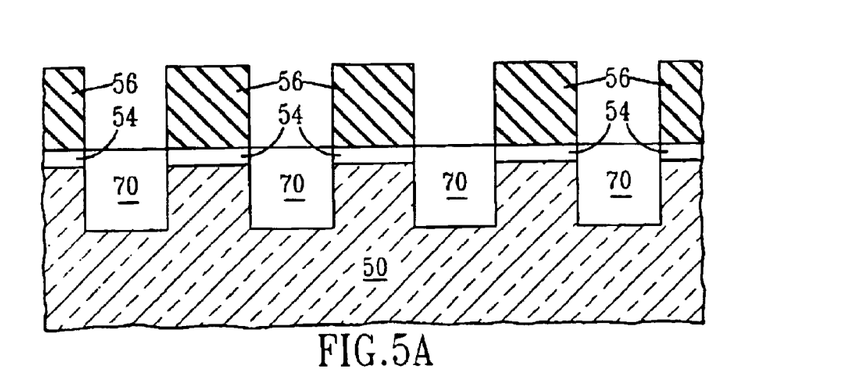
FIGS. 5A–5C are pictorial representation (through cross sectional views) illustrating another embodiment of the present invention for providing a structure in which portions of the trenches are treated with the plasma nitridation process of the present invention, while other potions of the trenches are protected with a block mask.
Figure 5B:
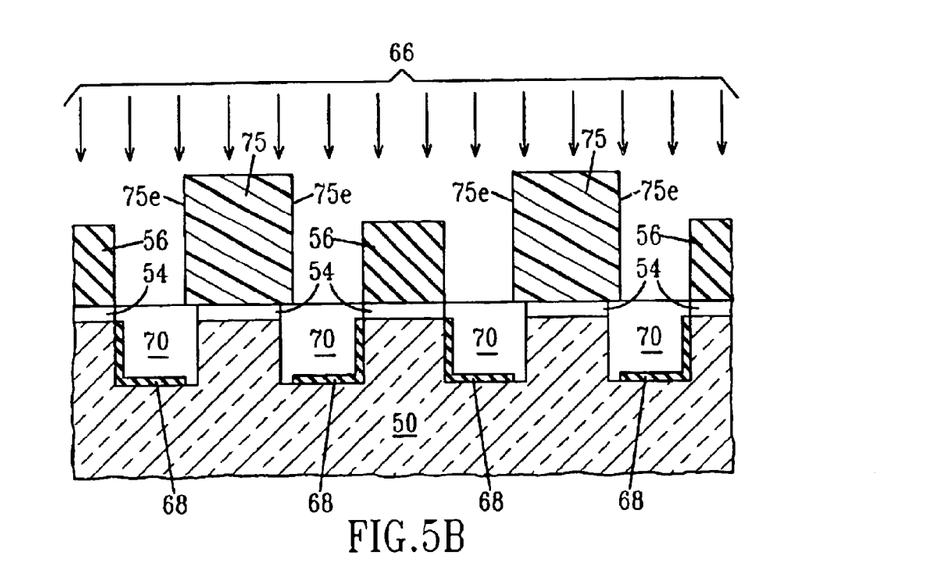
Figure 5C:
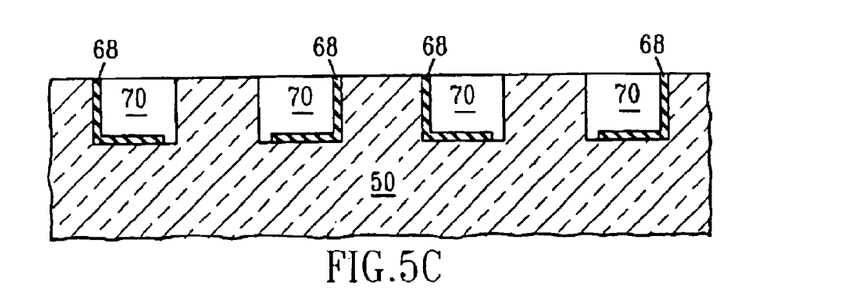

In addition to the above mentioned embodiments shown in FIGS. 3A–3E and FIGS. 4A–4B, the present invention also contemplates an embodiment in which a block mask is used to tailor which portions of the trenches are subjected to nitrogen plasma treatment. This embodiment of the present invention is shown in FIGS. 5A–5C. In this embodiment of the present invention, the structure shown in FIG. 3C is first provided using the procedures described above. Instead, of conducting a plasma nitridation process after the trenches have been etched into the semiconductor substrate 50 (as is the case in FIG. 3D), the trenches 60 are filled with a trench dielectric material 70 such as $SiO_2$, tetraethylorthosilicate (TEOS) or a high-density plasma oxide and thereafter the structure is planarized to the upper surface of the nitride pad 56 and then recessed to the upper surface of the pad oxide 54. An optional oxide liner may be formed prior to trench fill. A deglazing process may follow the trench fill step. FIG. 5A shows the structure formed at this point of this embodiment of the present invention.

After deglazing, preselected portions of remaining pad nitride 56 are removed and a block mask is formed in those areas in which PFET devices are to be formed. The block mask, which is formed atop preselected semiconductor islands, is comprised of a photoresist material and it is formed utilizing conventional deposition and lithography. In this embodiment, the block mask protects the PFET device areas from being nitrided. As shown, in FIG. 5B, edge portions 75e of block mask 75 extend over the sidewalls 62 of two neighboring isolation regions. The structure is then subjected to a nitrogen plasma treatment as is also shown in FIG. 5B. As illustrated, the structure is treated by a plasma of nitrogen 66 that is capable of forming a nitride liner 68 about the interior and exterior sidewalls and bottom walls of the trenches that are not protected with block mask 75. In this embodiment of the present invention, the nitride liner 68 lines portions of the sidewalls 62 and the bottom wall 64 of each trench 60, while the trench walls in other portions protected by the block mask are bare, i.e., no nitride liner is formed.

Next, the remaining pad nitride 56 and the pad oxide 54 are removed providing a structure having isolation regions formed in the surface of the semiconductor substrate. The resultant structure formed after the foregoing steps have been performed is shown in FIG. 5C. After stripping the pad nitride and the pad oxide from the structure, conventional CMOS device fabrication processes may now be performed which include at least the following: conventional gate oxidation pre-clean, and gate dielectric formation; gate electrode formation and patterning; gate reoxidation; source/drain extension formation; sidewall spacer formation by deposition and etching; source/drain formation; silicide formation; and a back-endof-the-line (BEOL) process.

During the oxidation procedures used above in forming the CMOS device, bird beaks form in conventional STI regions at or near the interface between the STI and substrate. In the present invention, nitrided surface layer 68 substantially prevents bird beaks from forming on some portions of the isolation regions, while bird beak formation is allowed to occur in those portions in which no surface nitrided layer is present, i.e., in the PFET device area. In the embodiment shown in FIGS. 5A–5C, the stress in the active areas for NFET device is reduced since bird beak formation is substantially eliminated, while the stress in the active areas for PFET occurs since bird beak formation is not prevented therein. This embodiment of the present invention thus allows one to tailor the stress caused by bird beak formation depending upon whether such stress degrades or improves the device performance. For example, bird beak formation in NFET devices leads to device performance degradation, while bird beak formation in PFET devices leads to enhanced device performance. In the foregoing example, bird beak formation causes a 17% decrease in current-on performance at a fixed current off for NFET devices, while a 17% increase in the same is observed for PFET devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for modifying stress formation in a semiconductor structure comprising the steps of:

providing a structure having a patterned material stack located on top of a surface of a semiconductor substrate, said patterned material stack having at least one opening that exposes a portion of the semiconductor substrate;

forming at least one trench into the exposed portion of the semiconductor substrate, each trench having sidewalls that extend to a common bottom wall;

filling said at least one trench with a trench dielectric;

forming a blockmask over a first region of said substrate leaving a second region of said substrate exposed;

removing said patterned material stack from said second region of said substrate; and subjecting at least one of the sidewalls and a portion of the common bottom wall of each trench in said second region of said substrate to a plasma nitridation process, wherein said first region of said substrate is subsequently processed to provide pFET devices.

2. The method of claim 1 wherein said block mask comprises an edge portion that extends beyond one sidewall of the at least one trench.

3. The method of claim 1 wherein the patterned material stack comprises at least a bottom pad oxide and a top pad nitride.

4. The method of claim 1 wherein the plasma nitridation process is carried out at in a nitrogen-containing atmosphere.

5. The method of claim 4 wherein the nitrogen-containing atmosphere comprises $N_2$, NO, $N_2O$, $N_3$; and mixtures thereof.

6. The method of claim 4 wherein the nitrogen-containing atmosphere is admixed with an inert gas selected from the group consisting of He, Ar, Ne, Kr, Xe and mixtures thereof.

7. The method of claim 1 wherein the plasma nitridation process comprises a plasma of $N_2$ in He.

8. The method of claim 1 wherein the plasma nitridation process is carried out using a plasma having a temperature of about 80° C. or below, while maintaining the substrate at a temperature of from 20° C. to about 100° C.

9. The method of claim 7 wherein the plasma nitridation process comprises a rapid thermal nitridation process in which the nitridation is performed for about 120 seconds or less.

10. The method of claim 1 wherein the plasma nitridation process is a decoupled plasma nitridation (DPN) process.

11. The method of claim 10 wherein the DPN process is performed using 2–10% $N_2$ in He at a pressure range between 50–100 m Torr. a power range from 50–260 Watts, and a plasma exposure time of from 10–50 seconds.

12. The method of claim 1 wherein said second region of said substrate is subsequently processed to provide nFET devices.

* * * * *